United States Patent [19]

Yaniv et al.

[11] Patent Number: 4,777,534
[45] Date of Patent: Oct. 11, 1988

[54] LIGHT PIPING SUBSTRATE FOR CONTACT TYPE IMAGE REPLICATION

[75] Inventors: Zvi Yaniv, Farmington Hills; Vincent D. Cannella, Birmingham, both of Mich.

[73] Assignee: Energy Conversion Devices, Inc., Troy, Mich.

[21] Appl. No.: 111,233

[22] Filed: Oct. 22, 1987

Related U.S. Application Data

[63] Continuation-in-part of Ser. No. 912,477, Sep. 29, 1986, Pat. No. 4,691,224, which is a continuation-in-part of Ser. No. 607,153, May 4, 1984, Pat. No. 4,660,095.

[51] Int. Cl.[4] .............................................. H04N 3/14
[52] U.S. Cl. .............................. 358/294; 358/213.11; 358/213.13; 357/30
[58] Field of Search ...................... 358/213.11, 213.13, 358/213.29, 213.31, 212, 294; 357/24 LR, 30 H, 30 G, 30 L; 250/578

[56] References Cited

U.S. PATENT DOCUMENTS

| 3,596,250 | 7/1971 | Weimer | 358/213.22 |
| 3,603,731 | 9/1971 | Weimer | 358/213.29 |
| 4,067,046 | 1/1978 | Nakatani et al. | 357/30 G |
| 4,149,197 | 4/1979 | Kos et al. | 250/578 |
| 4,226,898 | 10/1980 | Ovshinsky et al. | 357/2 |
| 4,390,791 | 6/1983 | Hatanaka et al. | 250/578 |
| 4,482,804 | 11/1984 | Oritsuki et al. | 358/213.11 |
| 4,660,095 | 4/1987 | Cannella et al. | 358/294 |

Primary Examiner—Jin F. Ng
Assistant Examiner—Stephen Brinich
Attorney, Agent, or Firm—Marvin S. Siskind; Richard M. Goldman

[57] ABSTRACT

Apparatus for the photogeneration of electrical signals representative of a detectable condition of an image-bearing surface. The apparatus includes an array of spaced, photosensitive elements formed from semiconductor alloy material and operatively disposed on a substantially loss-free, light transmitting faceplate preferably formed from a fused array of oriented optical fibers.

38 Claims, 3 Drawing Sheets

LIGHT PIPING SUBSTRATE FOR CONTACT TYPE IMAGE REPLICATION

CROSS-REFERENCE TO RELATED APPLICATIONS

This patent application is a continuation-in-part application of commonly assigned U.S. patent application Ser. No. 912,477 filed Sept. 29, 1986, now U.S. Pat. No. 4,691,224 which is a continuation-in-part of U.S. patent application Ser. No. 607,153 filed May 4, 1984, U.S. Pat. No. 4,660,095.

FIELD OF THE INVENTION

The present invention relates generally to apparatus adapted to photogenerate electrical signals representative of a detectable condition of an image bearing surface. The present invention more particularly relates to apparatus adapted to photogenerate electrical signals representative of a detectable condition of an image bearing surface such as a printed document by sensing the difference in intensity of radiation from the high and low optical density portions thereof. In its most specific form, the instant invention relates to a faceplate formed from an oriented, fused array of minute optical fibers capable of transmitting radiation from small area portions of an optically detectable image (disposed closely proximate the light incident face of the faceplate) to corresponding small area, thin film photosensitive elements (deposited upon the spacedly opposed light receiving face of the faceplate) without substantial transmission loss; said elements adapted to photogenerate electrical signals corresponding to the integrated amount of transmitted radiation.

BACKGROUND OF THE INVENTION

Systems for converting an image or other optically detectable surface condition, such as characters on a document, into electrical signals which can either be stored in memory for later recall or which can be transmitted to a remote location over, for example, telephone communication lines or similar systems, are well know in the reproduction art. Systems of this type have generally been referred to as line scanners. In one type of line scanner, the image bearing document is held stationary and a photosensor or an array of photosensors is scanned across each line of the document along with a localized light source. In another type of scanner, the array of photosensors and light source are held stationary and the image bearing document is moved therepast. In both types of image scanning systems, as the document is scanned, the high optical density or dark portions of the document reflect less light from the light source for reception by the photosensors than the low optical density or light portions. As a result, the high and low optical density portions can be contrasted by the photosensors for photogenerating electrical signals representative of the image on or other surface characteristic of the document.

While systems of the type described above have been generally successful in fulfilling their intended purposes and have found commercial acceptance these systems have exhibited several deficiencies. One major deficiency heretofore encountered in devices of this type has been the need either for a lens array to focus the reflected light onto the sensing element, or to locate the image bearing surface in extremely close relationship to the photosensitive elements operatively disposed to scan the image on that surface. This close relationship between the image on the image bearing surface and the photosensitive elements was required in order to facilitate the "proximate focusing" of light from a small area portion of the image onto a corresponding small area photosensitive element. Due to the fact that that light quickly diffuses, if the photosensitive elements are not located in close proximity to said small area portions of the image upon the image bearing surface, light emanating from one small area portion thereof will diffuse onto photosensitive elements not corresponding to said small area portion. The result is the photogeneration of false signals by said small area photosensitive elements, which false signals provide a replicated image of poor resolution and quality.

Heretofore, this necessity for maintaining a close physical relationship between said elements and said image bearing surface could only be satisfied by having said photosensitive elements and an overcoat layer disposed thereupon actually slidingly engage and slide across the image bearing surface, which motion between the image bearing surface and the array of photosensitive elements resulted in a second deficiency of prior art imaging systems; i.e., said deficiency being the build-up of a large static charge on the image bearing surface. Therefore, such prior systems required that precautions be taken to prevent that static charge on said image bearing surface from inducing an electrical charge in the spacedly positioned array of photosensitive elements, which induced charge would be capable of deleteriously affecting and possibly fatally damaging said photosensitive elements. Previous attempts to solve this problem have focused upon the use of a static shielding layer interposed between the image bearing surface and the array of photosensitive elements. While this approach has proven successful in eliminating the deleterious effects of the static charge, it has also served to lengthen the distance between the image bearing member and the photosensitive elements, thereby reducing the quality and resolution of the image being generated by the photosensitive elements.

Previous attempts to employ fiber optic bundles as deposition substrates upon which photodetectors may be deposited have failed due to the rough uneven nature of said bundles. Thus, workers in the field were reduced to depositing the photosensitive elements upon separate substrates, which were subsequently suspended above said bundles. The result being greater processing expense and substantially inferior optical resolution.

The invention disclosed herein solves both the problem of maintaining said photosensitive elements in close proximity to said image bearing surface as well as the problem of static build-up discussed hereinabove. The present invention includes a thick dielectric material which provides sufficient electrical isolation between the photosensitive elements of the array and the static electrical charge built up on the image bearing surface being scanned that said static charge cannot harm the spacedly positioned photosensitive elements. Additionally, the present invention transmits radiation emanating from small area portions of the image on said image bearing document to corresponding small area photosensitive elements with such high resolution and efficiency in transmission so as to effectively approximate the presence of a zero thickness window between the image bearing surface and the array of photosensitive elements. Therefore, in the practice of the invention disclosed herein, it is only necessary that a light piping mechanism be placed in sufficient proximity to the image bearing surface to accurately transmit radiation from said small area portions of that surface. Because small area portions of the light piping mechanism receive radiation from only corresponding small area portion of said image and said mechanism is capable of transmitting radiation incident thereupon virtually without loss to corresponding small area photosensitive elements, said array of photosensitive elements need not be operatively disposed in close proximity to said image bearing surface.

These and other objects and dvantages of the subject invention will become apparent from the perusal of the Detailed Description Of The Invention, the Drawings and the claims which follow hereinafter.

BRIEF SUMMARY OF THE INVENTION

The subject invention provides a new and improved image scanning type apparatus, said apparatus adapted to photogenerate electrical signals representative of a small area portion of an image on an image bearing surface, which image is projected, substantially without loss, onto an associated array of small area photosensitive elements. In accordance with one preferred embodiment of the invention, there is provided a contact type document scanner which is adapted to electronically scan said document or other image bearing surface disposed in relatively close proximity to the light incident face of a novel light piping faceplate.

The present invention therefore provides an apparatus adapted to photogenerate electrical signals representative of an image on an image bearing surface, which apparatus includes an array of spacedly disposed, continuous, small area, photosensitive elements formed from deposited, thin film semiconductor alloy material. Each of these small area elements is capable of effecting a detectabl electrical signal responsive to the intensity of light incident thereupon and emanating from a corresponding small area portion of the image on the image bearing surface. The array includes at least one column of light sensitive elements operatively disposed so as to cover at least a portion of at least one dimension of the image bearing surface. The photosensitive array is disposed upon a layer of transparent electrically conductive material fabricated from a material selected from the group consisting essentially of cermet, indium oxide, tin oxide, nickel silicide, chromium silicide, molybdenum silicide and combinations thereof. The layer forming the lower electrode of the photosensitive elements and disposed directly upon the upper, light receiving face of a light piping substrate fabricated from a fused array of minute, oriented optical fibers.

Each of the optical fibers from which said substrate is fabricated is capable of transmitting the optical image incident upon the lower, image contacting, light incident face of the substrate to the light receiving face of the substrate without substantial loss, i.e., with high resolution, efficiency, and low distortion. This optical characteristic provides for the fiber optic substrate to function to transmit light in such a manner as to be the optical equivalent of a zero thickness screen or window. The phenomenon of virtual loss-free transmission is accomplished due to the fact that such fused fiber optic substrates are characterized by the same type of "light piping" properties typically displayed by individually clad optical fibers. The advantage of using such fiber optic faceplates in contact-type document scanners is that, due to the loss-free, light piping characteristics exhibited by said faceplate, it becomes possible to position the array of photosensitive elements at a position distally removed from the image being scanned, without loss of resolution or quality of image. Further, by providing a fairly thick substrate, the photosensitive elements are separated a sufficient distance from the image bearing surface so that the build up of static electrical charges upon the image bearing surface will not destroy those photosensitive elements.

The semiconductor alloy material from which the photosensitive elements are fabricated is selected from the group consisting essentially of silicon, germanium, and combinations thereof and may further have one or more density of states reducing elements, such as hydrogen or fluorine, added thereto. The photosensitive elements may be operatively utilized as p-i-n-type photovoltaic diodes or photoresistors.

Preferably associated with each of the photosensitive elements is an isolation diode or field effect transistor for facilitating the selective addressing and detection of the electrical conductivity of each of said photosensitive elements by the application of read potentials to respective pairs of address lines associated with each of said elements.

Also included as part of the instant disclosure is a source for projecting light onto the image bearing member, said source operatively superposed at a spaced distance from the light receiving face of the light piping substrate nnd disposed on the side thereof opposite the image bearing surface. The light projecting source is adapted to transmit radiation through the interstitial segments of said light piping substrate, said interstitial segments defined by those surface areas of the substrate not having photosensitive elements or isolation elements deposited thereupon. The light projecting source is preferably adapted to project those wavelengths of light to which said photosensitive elements are responsive. The electrical signals photogenerated by said photosensitive elements in response to radiation incident upon each photosensitive element can thereafter be correlated to the image of small area portions of the image bearing surface adjacent each of the associated photosensitive elements.

DETAILED DESCRIPTION OF THE INVENTION

Figure 1:
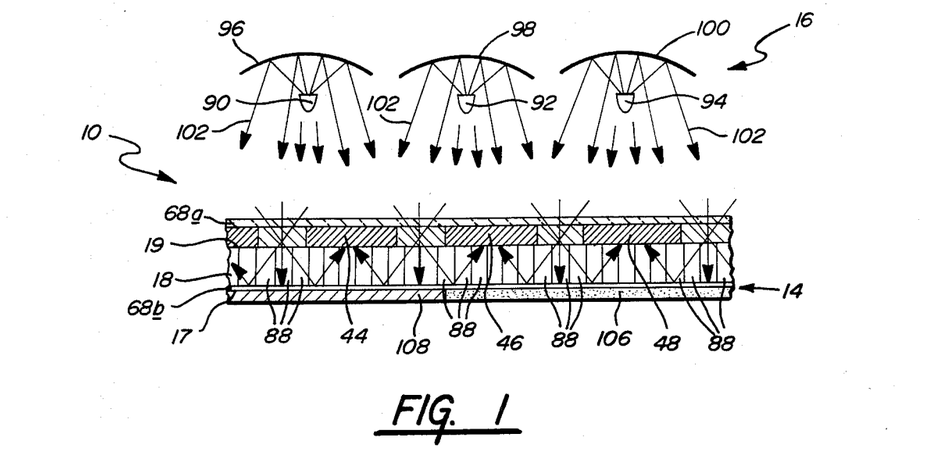
FIG. 1 is a partial side view, partly in cross section, of the contact type, document scanning system; said system including the light piping substrate integrally formed with the photosensitive elements of the present invention.
Figure 2:
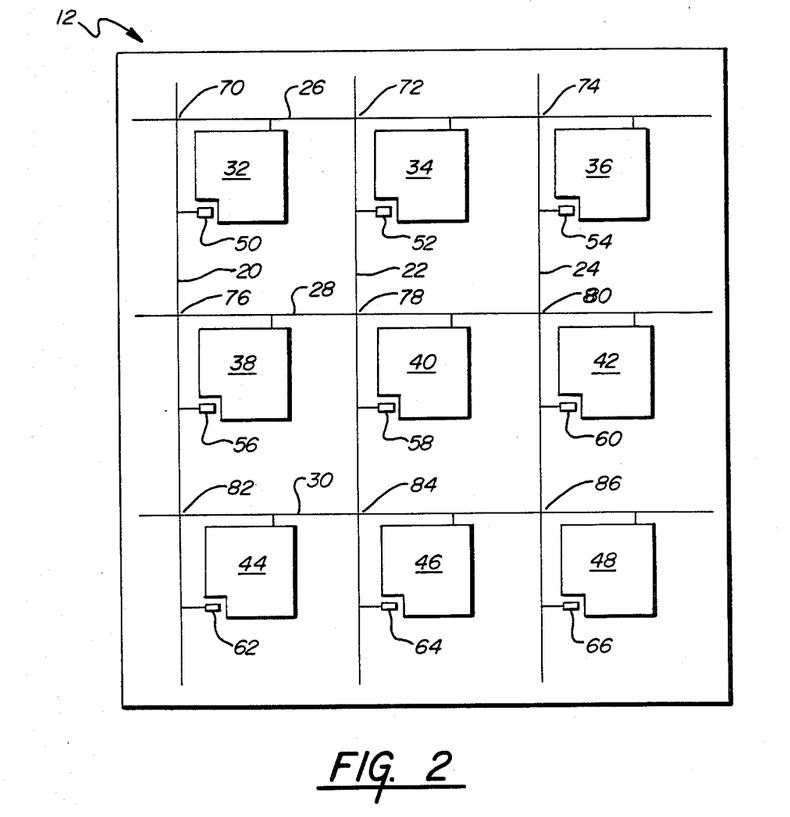
FIG. 2 is a somewhat stylistic top plan view of the contact type scanning system of the instant invention as shown in FIG. 1 with the photosensitive elements and associated isolation elements exposed.

FIGS. 1 and 2 illustrate a contact type, light piping document scanner system, generally designated by the reference numeral 10, said system embodying the concepts disclosed by the present invention. More specifically, the system 10 illustrated in FIG. 1 is generally adapted to photogenerate electrical signals representative of a detectable condition of an image on an image bearing surface, such as a document 14 disposed thereunder, and one or more light sources 16 disposed thereover.

The system 10 further includes a light piping substrate 18 having spacedly opposed relatively large area faces, said substrate adapted to transmit radiation incident upon one of the faces 17 thereof through the small area, interstitial portions thereof (as defined hereinafter), with relatively little loss, to the opposed face 19 thereof; a first set of X address lines including address lines 20, 22 and 24; a second set of Y address lines including address lines 26, 28 and 30; and a plurality of photosensitive elements 32, 34, 36, 38, 40, 42, 44, 46 and 48. The system 10 further includes an isolation device 50, 52, 54, 56, 58, 60, 62, 64 and 66 associated with each photosensitive element, and two oppositely disposed, transparent, protective cover layers 68a and 68b. The upper cover layer 68a is operatively disposed atop of the photosensitive elements and is adapted to protect the photosensitive elements from the environment; while the lower cover layer 68b is operatively disposed below the light incident face 17 of the light piping substrate 18 and adapted to protect the image bearing surface 14 from abrasion due to rough spots on the light incident surface 17 which movingly engages said image bearing surface, as explained in detail hereinafter. While it is preferable that such protective cover layers be provided, said layers can be eliminated without departing from the spirit or scope of the instant invention.

As can be appreciated from a perusal of FIG. 2, the X address lines 20, 22 and 24 and the Y address lines 26, 28 and 30 cross at an angle, and, as will be more apparent from the discussion which follows hereinafter, are spaced from one another to form a plurality of cross over points 70, 72, 74, 76, 78, 80, 82, 84 and 86. Associated with each of the cross-over points is a respective one on the photosensitive elements. The photosensitive elements 32–48 are formed on the light receiving face 19 of the light piping substrate 18 and are distributed thereover in spacedly disposed relationship to form a matrix of interstitial spaces 88 (see FIG. 1) between each of the contiguous pairs of the photosensitive elements. In this context, it is important that the photosensitive elements 32–48 are sized, configured and operatively disposed so as to occupy only a fraction (the exact fraction dependent upon the light source) of the surface area of the light receiving face 19 of the light piping substrate 18 so that incident radiation from light sources 90, 92 and 94 can pass therebetween to illuminate the image bearing surface therebelow.

The photosensitive elements 32–48 are further of the type which effect a detectable electrical characteristic in response to the receipt of light incident thereupon. As will be more fully described hereinafter, the photosensitive elements 32–48 can comprise photovoltaic cells or photoresistors which effect a detectable change in electrical conductivity in response to the receipt of incident light thereupon. The photosensitive elements are preferably formed from a deposited thin film semiconductor alloy material, such as an amorphous silicon and/or an amorphous germanium semiconductor alloy. Preferably the amorphous semiconductor alloy material includes in addition to silicon hydrogen and/or fluorine which are adapted to reduce the density of states. Such alloys can be deposited by plasma assisted chemical vapor deposition, such as glow discharge, as disclosed for example in U.S. Pat. No. 4,226,898 which issued on Oct. 7, 1980 in the names of Stanford R. Ovshinsky and Arun Madan for "Amorphous Semiconductors Equivalent to Crystalline Semiconductors Produced by a Glow Discharge Process."

Each of the isolation devices 50–66 is associated with a respective one of the photosensitive elements 32–48. The isolation devices are also preferably formed from a deposited semiconductor alloy material, and most preferably from an amorphous silicon and/or germanium semiconductor alloy material. The amorphous silicon alloy material can also include hydrogen and/or fluorine as density of state reducing materials, which materials can be deposited by plasma assisted chemical vapor deposition as disclosed in the aforementioned U.S. Pat. No. 4,226,898. As can be noted from a perusal of FIG. 2, each of the isolation devices 50–66 is coupled in electrical series relation with an associated photosensitive element 32–48 between respective pairs of the X address lines 20, 22, and 24 and the Y address lines 26, 28, and 30 (other types of multiplexing schemes may be employed without departing from the spirit or scope of the subject invention). As a result, the isolation devices 50–66 facilitate the selective addressing and hence the detection of the electrical conductivity of each of the photosensitive elements by the application of read potentials to respective pairs of the X and Y address lines.

Referring more particularly to FIG. 1, the light source, generally 16, comprises a plurality of individual, spacedly positioned light sources 90, 92 and 94. Associated with each of the sources 90, 92 and 94 is a reflector 96, 98 and 100. The light sources 90, 92 and 94 and the respective reflectors 96, 98 and 100 are arranged to provide rays of uniform, diffused light, as indicated by the arrows 102; which rays of light are projected onto the side of the light piping substrate 18 opposite the image bearing surface 14 to be scanned. The image bearing surface 14 is operatively disposed immediately adjacent the light incident surface 17 of the light piping substrate 18. It is to be noted that in the preferred embodiment, the light incident surface 17 is illustrated as being substantially planar; however, (and although not illustrated) said light incident surface 17 may in fact be non-planar as long as that non-planar surface substantially conforms to the contour of the image-bearing surface 14. And while the light incident surface 17 may be formed to assume non-planar configurations, the light receiving surface 19 is preferably as planar as possible so as to simplify the deposition thereupon of said layers of semiconductor alloy material from which said photosensitive elements are fabricated. Further, and as previously mentioned, the light incident surface 17 includes, on the image bearing surface-contacting side thereof, a protective coating layer 68b for preventing abrasion of the image bearing surface 14; said protective layer preferably formed of an oxide, nitride and/or carbide of silicon. The image bearing surface 14 includes at least one portion of high optical density 106, hereinafter referred to as the dark portion of the image bearing surface and at least one portion of low optical density 108, hereinafter referred to as the light portion of the image bearing surface.

The protective layer 68b (where applicable) is preferably relatively thin so that the image bearing surface 14 is closely spaced in juxtaposed relation to the light incident face 17 of the light piping substrate 18. Either the cover layer 68b, or the light incident face 17 (if no cover layer is employed), must be disposed in close proximity to the image bearing surface 14 so that light emanating from said image bearing surface 14 will strike said light incident face 17 without substantial attenuation. The key element which typifies this type of "proximity focusing" is a substantial one-to-one relationship between the size of the small area portion of the image on the image bearing surface 14 and the size of the corresponding photosensitive element.

The light piping substrate 18 is preferably a fiber optic faceplate composed of a fused array of minute, oriented optical fibers adapted to transmit an optical image formed on a small area portion of the light incident face 17 thereof to the light receiving face 19, with high resolution, a high degree of efficiency and little attenuation. As used herein, oriented refers to optical fibers wherein each distinct fiber maintains a substantially aligned, uniform position with respect to every other fiber. The thickness of the light piping substrate 18 is chosen to maximize the electrical isolation of the photosensitive elements from the static charge built up on the image bearing surface 14, while still providing for optimum transmission of the radiation transmitted from the light incident face 17 to the light receiving face 19. The light receiving face 17 of said light piping substrate 18 should be substantially smooth, being free from defects, irregularities and surface roughness which could mar or otherwise deleteriously effect the image bearing surface 14 against which it moves.

It is necessary to etch, score or otherwise degrade the interstitial portions of said light incident face 17 so as to facilitate the diffusion and scattering of radiation reflected thereonto from the image on the image bearing surface 14. The point to be considered when determining the extent to which to degrade the light incident face 17 is whether light transmitted through the discrete optical fibers of said light piping substrate 18 is sufficiently spaced from the reflective surface of said image bearing surface 14 to angularly diffuse from the small area portions of the image bearing surface which it strikes and be received in adjacent optical fibers for transmission to a corresponding photosensitive element Turning now to FIG. 3 for an illustration of the provision of a light incident face 17 of the substrate 18 which is capable of diffusing light from non-shielded optical fibers onto associated small area portions of the image bearing surface 14; it is to be noted that a plurality of optical fibers 18a are depicted as generally extending perpendicularly between the light receiving face 19 and the light incident face 17 of said light piping substrate 18. Those fibers 18a underlying the photosensitive elements and the isolation elements have a smooth, substantially defect-free light incident, distal face. However, those fibers 18b underlying the interstitial segments of the light piping substrate 18 (between adjacent photosensitive elements and isolation elements) have had the light incident face thereof degraded. In this manner, light from the source 16 which passes through the interstitial segments of the light piping substrate 18 is diffused and does not reflect directly from the image bearing surface 14 adapted for operative disposition immediately therebelow and return up the same optical fiber from whence it emanated. Rather, those rays of light 102 transmitted along optical fibers 18b angularly diffuse and are reflected to the light incident faces of adjacent fiber optical pipes 18a for transmission to corresponding small area photosensitive elements. Again, however, it is to be noted that this is only required in those instances wherein the surface finish of the image bearing surface is not sufficient to provide for the inherent diffusion of those rays of light. Finally, note that the light incident distal faces of optical fibers 18b can be degraded by simple lithographic etching techniques well known to those skilled in the art. Depending upon the roughness of those faces 18b after the etching process, it may be necessary to deposit said smooth protective cover layer 168b thereupon.

When the image bearing surface 14 is to be scanned, it is first placed in substantial close proximity to the scanning system 10 and in substantially close proximity (and may even be in sliding contact) with the light incident face 17 of the light piping substrate 18. The light source 16 is then energized for projecting diffused rays of light 102 onto the upper protective cover layer 68a operatively disposed atop the photosensitive elements for transmission through the interstitial spaces of said light piping substrate 18 defined between said photosensitive elements. The rays of light which do not impinge upon the shielded upper electrode (as detailed hereinafter) of the photosensitive elements are transmitted through the light piping substrate 18 for projection onto the image bearing surface 14 for reflection therefrom onto the adjacent light incident face 17 of the light piping substrate 18. On the dark portions 106 of the image bearing surface 14, the rays of light 102 will be substantially absorbed so that very little of the light impinging thereupon will be reflected back through corresponding optical fibers of the light piping substrate 18 so as to be received by the photosensitive elements deposited upon the light receiving face 19 thereof, for example, photosensitive elements 44 and 46. However, rays of light striking light portions 108 of the image bearing surface 14 will not be substantially absorbed; therefore a considerably larger percentage of the light incident upon those light portions 108 will be reflected back through corresponding optical fibers of the light piping substrate 18 so as to be received by corresponding photosensitive elements adjacent thereto, such as photosensitive element 48. The photosensitive elements adjacent and corresponding to the light portions 108 of the image bearing surface 14 will thereby affect a detectable change in the electrical conductivity thereof. When the photosensitive elements are formed from photovoltaic cells for operation in the fourth quadrant of their IV curve, the incident radiation will not only affect the change in electrical conductivity but will in fact photogenerate current to charge or discharge a preset threshold signal. If, however, the photosensitive elements are photoresistors adapted for third quadrant operation, radiation incident upon said photosensitive elements will affect an increase in electrical conductivity which can be detected by the application of read potentials to the respective pairs of the X address lines 20, 22 and 24 and the Y address lines 26, 28 and 30.

Electrical signals representing a faithful reproduction of the image bearing surface 14 can be obtained because the photosensitive elements 32-48 can be made very small (micron-scale). For example, the photosensitive elements are made to have dimensions of no more than approximately 90 microns on a side. The isolation means 50-66 are formed to have dimensions of about 10 to 40 microns on a side, preferably 20 microns on a side. Also, the photosensitive elements 32-40 are spaced apart so that they cover only a certain portion of the light receiving face 19 of the light piping substrate 18 to permit rays of light 102 to be projected therebetween and through the interstitial segments of the substrate 18 and to be defused onto the image on the image bearing surface 14 to be scanned. For example, the photosensitive elements may be spacedly disposed so as to cover only about 20 to 80 percent of the overall surface are of the light receiving face 19 of the light piping substrate 18, thereby providing a substantial pathway for the rays of light 102.

It is informative to note that the photosensitive elements can be arranged in substantially co-planar relationship so that each will be equally spaced from the iamge bearing surface 14 to be scanned; though it is also important to realize for the purposes of the present invention, that it is not necessary that said photosensitive elements be spaced equidistantly from the image bearing surface for proximity focusing of said image bearing surface 14 relative thereto. Rather, it is only necessary that the light incident face 17 of the light piping substrate 18 be located proximate said image bearing surface 14. This is because the optical fibers of the light piping substrate 18 are capable of transmitting light between the distal faces thereof without loss. Therefore, as long as the small area portions of the light incident face 17 receives light from corresponding small area portions of image bearing surface 14, that light will be faithfully transmitted to the light receiving face 19 and the photoresponsive element associated therewith. It is further important to note that although FIG. 2 illustrates a 3×3 matrix of photosensitive elements, said matrix is merely illustrative and a much larger array of elements would actually be required for 3 dimensional scanning. However, a movable linear array of photosensitive elements, such as a 1×n matrix could be utilized to movably scan the image on said image bearing surface 14.

The electrical characteristics, and, in accordance with this preferred embodiment, the electrical conductivity of the photosensitive elements can be detected by applying read potentials to respective pairs of the X and Y address lines in series and one at a time. However, and most preferably, the photosensitive elements can be divided into groups of elements and the read potentials can be applied to each group of elements in parallel to facilitate a more rapid scanning of the image bearing surface 14. Within each group of photosensitive elements, the elements can be scanned in series.

Figure 3:
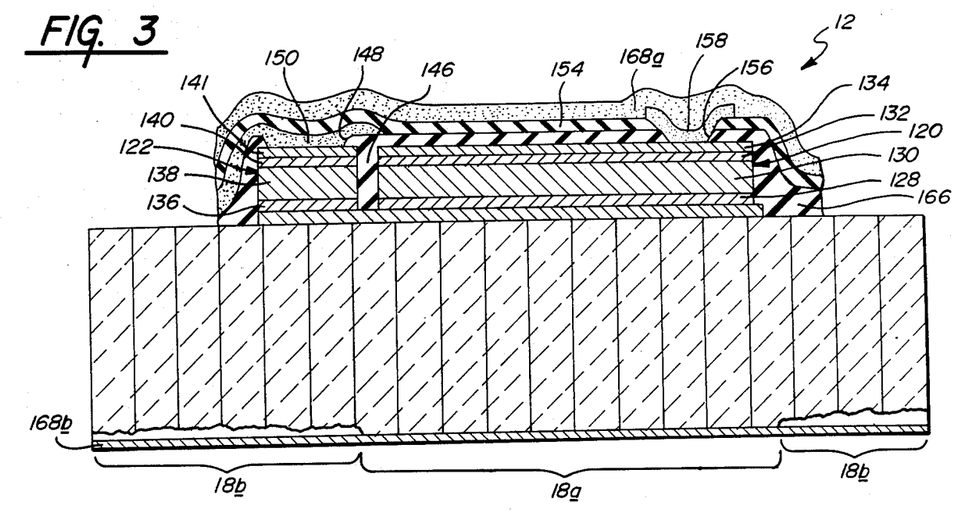
FIG. 3 is a partial cross-sectional side view of a photosensitive element and associated isolation element structured and operatively disposed atop light piping substrate in accordance with a preferred embodiment of the present invention.
Figure 4:
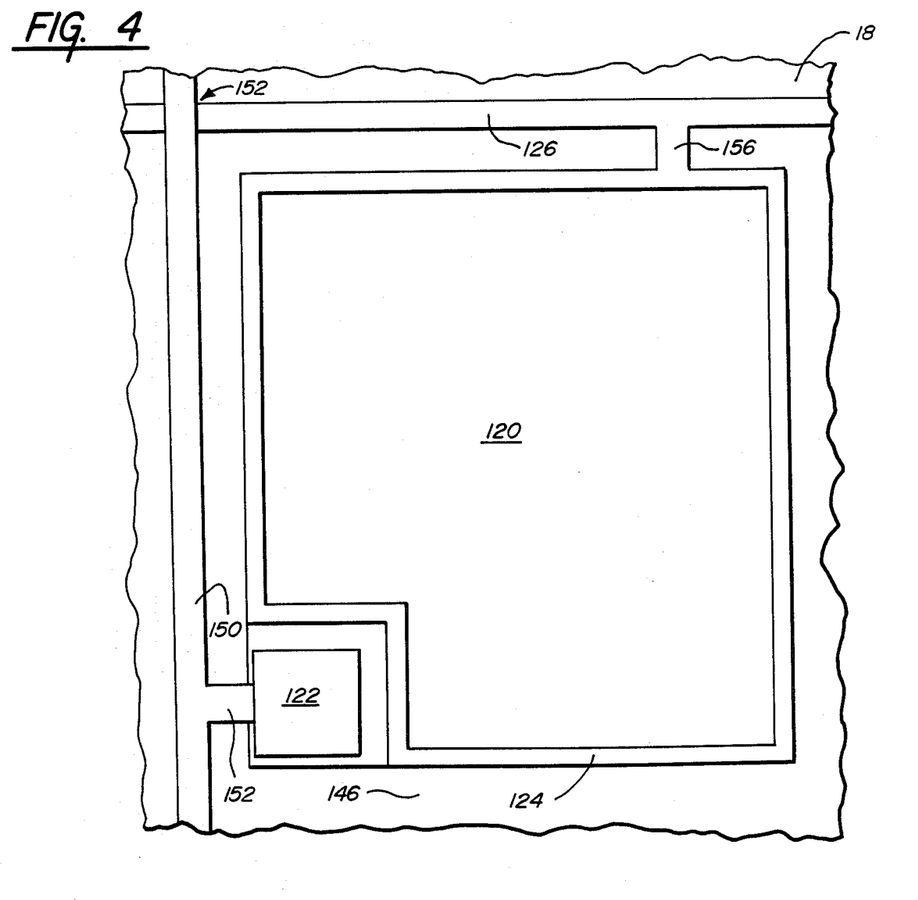
FIG. 4 is an enlarged top plan view of one of the light sensitive elements and associated isolation element illustrated in FIG. 3.

Referring now to FIGS. 3 and 4, there is illustrated in greater detail, a configuration of a photosensitive element 120 and an associated isolation element 122 in accordance with the present invention. Here, the system 10 includes a light piping substrate 18 having formed thereupon a pad of transparent, electrically conductive material 124. The conductive pad 124 can be formed from a transparent cermet, indium tin oxide, nickel silicide, tin oxide, chromium silicide, molybdenum silicide, and combinations thereof. It is only important that said conductive pad be substantially transparent to the wavelengths of radiation to which said photosensitive elements are responsive, while also being sufficiently conductive to form the bottom electrode therefor.

Formed on the conductive pad 124 is the photosensitive element 120 which can take the form of a photovoltaic cell. The photovoltaic cell or photosensitive element 120 can include a body of an amorphous semiconductor alloy material having a first doped region 128, an intrinsic region 130, and a second doped region 132. The regions 128 and 132 are preferably doped so as to be opposite in conductivity-type wherein the region 128 is a p type region and the region 132 is an n type region. Overlying the n type region 132, there is deposited is a layer of an opaque, electrically conductive, metallic material 134. Photovoltaic cells of this type are fully disclosed, for example in the aforementioned U.S. Pat. No. 4,226,898 and therefore need not be described in further detail herein.

The isolation element 122, fabricated in accordance with the principles of this embodiment of the invention, preferably comprises diode also formed from a body of an amorphous semiconductor alloy material having a p type region 136, a substantially intrinsic region 138 and an n type region 140. Overlying the n type region 140, is a pad-like layer of an opaque electrically conductive material 141.

The metallic pads 134 and 141, in addition to serving other functions which will be elaborated upon hereinafter, also are adapted to function as light shields for preventing the rays of light 102 projected by light source 16 (of FIG. 1) from impinging upon the active layers of the isolation elements or the photosensitive elements in any direction other than the direction of reflection from the image bearing surface 14. This function of the metal pads 134 and 141 is essential when the scanning system 12 is to be used in accordance with the embodiment illustrated in FIG. 1. Of course, in those instances in which the image bearing document 14 can be back-lit opaque metallic pads are not necessary and the electrodes 134 and 141 may be transparent.

The isolation element 122 is also formed upon the metal pad 124, though it is otherwise insulated from said photosensitive element 120 by a layer of deposited insulating material 146 which can be fabricated from, for example, silicon oxide or silicon nitride. Since the isolation diode 122 and the photosensitive element 120 are formed with the same layer composition and structure, said isolation diode 122 can be formed during the same deposition process as the photovoltaic element 120.

The isolation diode 122 is coupled to the photovoltaic cell 120 by means of the transparent electrically conductive pad 124 in an anode to anode relationship, i.e., the interconnection is made between the p-type layers. Formed in the layer of insulating material 146 which isolates the elements from one another is an opening 148 which permits a metal lead 150 to be deposited so as to place said diode 122 in electrical communication with an X address line 152. Overlying the insulator 146 and the metal lead 150 is a second layer of insulating material 154. Also formed in the insulating layers 146 and 154 is an opening 156 which permits another metal lead 158 to provide a Y address lead line. The structure of FIG. 3 is completed by the deposition of oppositely disposed layers of a wide band gap, protective, transparent material 168a and 168b which may be formed from, but is not limited to, a deposited layer of silicon oxide, silicon nitride, silicon carbide, and combinations thereof.

The metal lead 152 electrically connecting the isolation element 122 to the X address line 150 can be more completely appreciated from a perusal of FIG. 4. Further, the metal pad 156 electrically connecting said photosensitive element 120 to the Y address line 126 is also more particularly illustrated in FIG. 4. As can be noted therefrom, the X address line 150 and the Y address line 126 are spaced apart and must be electrically isolated from one another. Due to the fact that the address lines cross at an angle and are separated by insulation material from one another, an insulated crossover point 152 is thereby formed.

Figure 5:
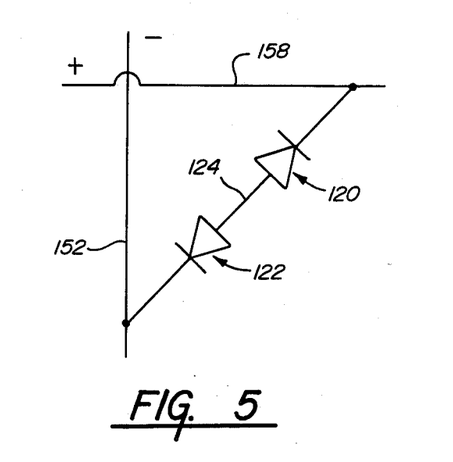
FIG. 5 is the equivalent circuit diagram of the light sensitive element and isolating element of FIG. 3 as operatively connected to the address lines of the x-y matrix.

Referring now to FIG. 5, there is illustrated the equivalent circuit diagram of the photosensitive element 120 and the isolation element 122. Due to the fact that the isolation element 122 and the photosensitive element 120 are formed on a common conductive pad 124, the anode of the isolation diode 122 and the photosensitive element 120 are electrically coupled together in anode to anode relationship. The cathode of the photosensitive element 120 is electrically coupled to the Y address line 158 and the c thode of the isolation diode 122 is electrically coupled to the X address line 152. In order to read the condition of the photosensitive element 120, a negative potential is applied to the X address line 152 and a positive potential is applied to the Y address line 158 to forward bias the isolation diode 122. If light is reflected off of a light (low density) small area portion of the image on the image bearing surface 14 and onto the corresponding photosensitive element 120, a current will be photogenerated by said photosensitiv element and will be detected through the forward biased isolation diode 122. However, if the small area photosensitive element is disposed to receive light from an associated dark (high density) small area portion of the image bearing surface 14, substantially no light will be reflected from and be incident upo the photosensitive element and hence substantially no current will be photogenerated by said photosensitive element. The difference between the two levels of photogenerated current can therefore is contrasted for deriving an electrical signal representative of the small area image portions corresponding to each of the photosensitive elements.

It should be understood that the present invention is not limited to the precise structure illustrated in the described embodiments. It is intended rather that foregoing descriptions of the presently preferred embodiments be regarded as illustrative rather than as a limitation of the present invention. It is therefore the following claims, including all equivalents, which define the scope of the instant invention. Thus, it is possible to effect minor changes to the embodiments of the present invention without departing from the spirit or scope of the invention.

We claim:

1. Imaging apparatus adapted to generate electrical signals representative of a detectable condition of an image-bearing surface; said apparatus comprising:
    a light-piping substrate having spacedly opposed relatively large area faces, said substrate adapted to transmit radiation directed from small area segments of an image-bearing surface and incident on corresponding small area segments of a light incident face of the substrate operatively positioned proximate thereto, with relatively little loss, onto the corresponding small area segment of the spacedly opposed, light receiving face of said substrate;
    a large area array of spacedly disposed, small area thin film photosensitive elements operatively disposed upon said light receiving face of said light piping substrate, each of said elements aligned with and adapted to generate an electrical signal substantially corresponding in intensity to the amount of light transmitted by corresponding small area segments of said light-receiving face; and
    means for selectively addressing each discrete photosensitive element of the large area array for sensing the photogenerated signal.

2. Apparatus as in claim 1, wherein said light piping substrate comprises a faceplate formed from a fused array of individually clad optical fibers.

3. Apparatus as in claim 1, wherein interstitial portions of said light incident face are defined between photosensitive elements and are degraded to facilitate the scattering and diffusion of light emanating therefrom.

4. Apparatus as in claim 3, wherein said interstitial portions of said light incident face are etched.

5. Apparatus as in claim 3, wherein said interstitial portions of said light incident face are degraded.

6. Apparatus as in claim 1, wherein said light receiving face of said substrate is substantially smooth for the deposition thereupon of said photosensitive elements.

7. Apparatus as in claim 1, wherein the light incident face of said light piping substrate is formed in a substantially non-planar configuration.

8. Apparatus as in claim 1, wherein said light incident face of said substrate is adapted to contact an image-bearing surface.

9. Apparatus as in claim 8, further including a hard protective covering overlying said light incident face.

10. Apparatus as in claim 2, wherein the thickness of said faceplate is about 1/10 inch to ½ inch.

11. Apparatus as in claim 2, wherein the preferred thickness of said faceplate is ¼ inch.

12. Apparatus as in claim 1, wherein said thin film photosensitive elements are photovoltaic cells.

13. Apparatus as in claim 1, wherein said photosensitive elements are formed from contiguous layers of deposited semiconductor alloy material.

14. Apparatus as in claim 13, wherein said layers of semiconductor alloy material include an amorphous silicon alloy material.

15. Apparatus as in claim 14, wherein said amorphous silicon semiconductor alloy material further includes at least one density of states reducing element selected from the group consisting essentially of hydrogen and fluorine.

16. Apparatus as in claim 1, wherein said photosensitive elements comprise p-i-n-type photodiodes.

17. Apparatus as in claim 12, wherein said photovoltaic cells include at least a first doped region of semiconductor alloy material; a substantially intrinsic region of semiconductor alloy material; and a second doped region of semiconductor alloy material of opposite conductivity with respect to said first doped region.

18. Apparatus as in claim 17, further including a layer of opaque, electrically conductive material deposited atop the uppermost layer of semiconductor alloy material so as to limit illumination of said photosensitiv elements to radiation emanating from the light incident face of the substrate.

19. Apparatus as in claim 18, wherein said opaque conductive layer further functions as the upper electrode of said photosensitive elements.

20. Apparatus as in claim 18, wherein said opaque conductive layer is selected from the group consisting essentially of aluminum, molybdenum, nickel, chromium, and combinations thereof.

21. Apparatus as in claim 1, wherein said photosensitive elements further include a layer of transparent electrically conductive material disposed directly upon the light receiving face of said light piping substrate.

22. Apparatus as in claim 21, wherein said layer of transparent conductive material is selected from the group consisting essentially of transparent cermets, nickel silicide, chromium silicide, molybdenum silicide, conductive oxides, and combinations thereof.

23. Apparatus as in claim 22, wherein said layer of transparent conductive material forms a distinct pad upon which said photosensitive element is deposited.

24. Apparatus as in claim 23, further including at least one isolation element associated with each photosensitive element, said isolation elements adapted to facilitate selective addressing of said photosensitive elements; said isolation elements deposited on the same pads a the photosensitive element associated therewith.

25. Apparatus as in claim 24, wherein said isolation elements comprises diodes.

26. Apparatus as in claim 25, wherein said diodes are formed of layers of deposited semiconductor alloy material.

27. Apparatus as in claim 25, wherein said isolation elements comprise thin film transistors.

28. Apparatus as in claim 27, wherein said thin film transistors are field effect transistors.

29. Apparatus as in claim 24, further including light shielding means disposed upon the photosensitive elements.

30. Apparatus as in claim 29, further including light shielding means disposed upon the isolation elements.

31. Apparatus as in claim 30, wherein said light shielding layer comprises a layer of opaque, electrically conductive material deposited upon the surface of both said isolation means and said photosensitive element opposite said light piping substrate.

32. Apparatus as in claim 30, wherein said opaque shielding layer is selected from the group essentially consisting of aluminum, chromium, molybdenum, nickel and combinations thereof.

33. Apparatus as in claim 32, wherein said opaque shielding layer further provides an address lead connecting said isolation elements to a first plurality of address lines and connecting said photosensitive elements to a second plurality of address lines; said second plurality of address lines electrically insulated from said first plurality of address lines.

34. Apparatus as in claim 31, further including a light source adapted to project light through said imaging apparatus onto an image bearing surface operatively disposed therebelow; said light source positioned above the light incident face of said light piping substrate.

35. Apparatus as in claim 34, wherein said light shielded isolation elements and said light shielded photosensitive elements are spacedly disposed in a common horizontal plane so as to provide for radiation from said light source to pass vertically therebetween and illuminate an image bearing surface disposed therebeneath.

36. Apparatus as in claim 35, wherein the number and size of spacedly disposed photosensitive elements and isolation elements provide sufficient unshielded interstitial area to provide for the transmission therebetween of about 20–80 percent of radiation from said light source.

37. Apparatus as in claim 1, further including a protective layer deposited atop the exposed surface of said photosensitive elements.

38. Apparatus as in claim 37, wherein said protective layer comprises a wide band gap material selected from the group consisting essentially of silicon oxide, silicon nitride, silicon carbide, and combinations thereof.

* * * * *